(12) United States Patent
Aboush (10) Patent No.: US 9,819,323 B2
(45) Date of Patent: Nov. 14, 2017

(54) INTEGRATED CIRCUIT FIELDS CANCELLER SYSTEM

(71) Applicant: Qualcomm Technologies International, Ltd., Cambridge (GB)

(72) Inventor: Zaid Aboush, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 52 days.

(21) Appl. No.: 14/993,373

(22) Filed: Jan. 12, 2016

(65) Prior Publication Data
US 2017/0201223 A1    Jul. 13, 2017

(51) Int. Cl.
| | |
|---|---|
| H03H 7/09 | (2006.01) |
| H03H 7/01 | (2006.01) |
| H03B 5/08 | (2006.01) |
| H03H 7/42 | (2006.01) |
| H01F 19/04 | (2006.01) |
| H01F 27/38 | (2006.01) |
| H03B 1/04 | (2006.01) |

(Continued)

(52) U.S. Cl.
CPC ........... *H03H 7/0138* (2013.01); *H01F 19/04* (2013.01); *H01F 27/385* (2013.01); *H03B 1/04* (2013.01); *H03B 5/08* (2013.01); *H03H 7/42* (2013.01); *H04B 1/0475* (2013.01); *H01F 17/0006* (2013.01); *H03F 2200/09* (2013.01); *H03F 2200/541* (2013.01); *H03F 2203/45731* (2013.01); *H03H 1/0007* (2013.01); *H03H 7/0115* (2013.01); *H03H 7/1758* (2013.01); *H03H 2001/0078* (2013.01); *H03H 2007/013* (2013.01)

(58) Field of Classification Search
CPC .................................. H03H 7/42; H03H 7/09
USPC .......................... 333/25, 4, 177, 119; 336/182
See application file for complete search history.

(56) References Cited

U.S. PATENT DOCUMENTS

| | | | |
|---|---|---|---|
| 6,087,822 A | 7/2000 | van der Veen | |
| 8,203,399 B2 * | 6/2012 | Kim | ........................ H03F 3/211 333/177 |

(Continued)

OTHER PUBLICATIONS

Schmalz K., et al., "A 245 GHz Transmitter in SiGe Technology", 2012 IEEE, RM03D-1, Radio Frequency Integrated Circuits Symposium (RFIC), Montreal, QC, Canada, Jun. 17-19, 2012, IEEE, Piscataway, NJ, USA, Jun. 17, 2012, XP032203335, pp. 195-198.

(Continued)

*Primary Examiner* — Dean Takaoka
(74) *Attorney, Agent, or Firm* — Procopio, Cory, Hargreaves & S (57) ABSTRACT

The present disclosure relates to a circuit for suppressing unwanted magnetic interference. The circuit can have a transformer having a first coil, a first pair of input terminals, and a first pair of output terminals. The transformer can produce a first magnetic field. The circuit can also have a harmonic trap. The harmonic trap can have a second coil and a second pair of input terminals operably coupled to the first pair of input terminals. The harmonic trap can produce a second magnetic field opposing the first magnetic field. The harmonic trap can suppress electrical signals of at least one of the first input terminals and the first output terminals of the transformer at a resonant frequency of the harmonic trap. The harmonic trap can also suppress the first magnetic field in a far field.

30 Claims, 9 Drawing Sheets

(51) Int. Cl.
    *H04B 1/04*     (2006.01)
    *H01F 27/34*     (2006.01)
    *H01F 17/00*     (2006.01)
    *H03H 1/00*     (2006.01)

(56) References Cited

U.S. PATENT DOCUMENTS

| | | | |
|---|---|---|---|
| 8,208,887 B2* | 6/2012 | Lee | H04B 1/18 |
| | | | 455/292 |
| 8,818,302 B2* | 8/2014 | Tombak | H03F 3/45076 |
| | | | 330/252 |
| 9,407,379 B2* | 8/2016 | Lau | H04B 15/06 |
| 9,584,076 B2* | 2/2017 | Ortiz | H03F 1/565 |
| 2010/0026411 A1 | 2/2010 | Liu et al. | |
| 2010/0172168 A1 | 7/2010 | Fells | |
| 2014/0347142 A1* | 11/2014 | Chang | H03H 7/0184 |
| | | | 333/25 |
| 2015/0194811 A1 | 7/2015 | Mao | |

OTHER PUBLICATIONS

International Search Report and Written Opinion—PCT/EP2016/078359—ISA/EPO—Mar. 1, 2017.

\* cited by examiner

INTEGRATED CIRCUIT FIELDS CANCELLER SYSTEM

TECHNICAL FIELD

This disclosure relates to a circuit and system for reducing interference, and in particular relates to a circuit and system for reducing interference in transceivers.

BACKGROUND

Modern transceiver integrated circuits may contain on-chip coils such as inductors and Balun transformers. These coils can produce very efficient and linear systems especially on the transmitter side.

In order to up-convert or down-convert baseband signals to or from Radio Frequency (RF) signals, many transceiver circuits also have a local oscillator running at a RF oscillation frequency on chip. A Voltage Controlled Oscillator (VCO) can be implemented as an on-chip local oscillator which uses an inductor in parallel with a variable capacitor coming from a varactor for tuning the oscillation frequency.

The transceiver circuits work with power amplifiers and act to filter out power amplifier output signals at unwanted frequencies before transmitting the output signals. Power amplifiers in certain classes such as D, E, F, etc. are digital power amplifiers and use digital signals to create sinusoidal RF waveforms. These digital signals contain square waves which are rich in harmonic frequency components. The harmonic signals can interfere in the far field with passive on-chip components, such as the VCO. The harmonic signals may cause magnetic and/or electric coupling to coils in these components, which may lead to unfixable system disturbance in some applications. An example is the potential coupling between the digital power amplifier coil(s) and a VCO inductor, including the situation when transmitter harmonic frequencies substantially coincide with a VCO oscillation frequency or harmonic frequency, the transmitter harmonic signals may cause serious VCO pulling, i.e. frequency variations in the oscillation frequency, and poor spectral purity.

There is therefore a need for an improved circuit and system that help reduce magnetic and/or electric coupling in transceiver circuits.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one aspect, there is provided herewith a circuit, comprising a transformer, comprising a coil, input terminals and output terminals, a harmonic trap, comprising a coil and input terminals, wherein the harmonic trap is configured to suppress electrical signals at the input or output terminals of the transformer at a resonant frequency of the harmonic trap, wherein the input terminals of the harmonic trap are electrically connected to the input terminals of the transformer in a configuration such that the harmonic trap and the transformer have opposing current polarities and that a magnetic field induced by a current of the harmonic trap suppresses a magnetic field induced by a current of the transformer in the far field substantially at the harmonic trap resonant frequency.

In an embodiment, the input terminals of the transformer are configured to receive signals from a digital Power Amplifier.

In one embodiment, the input terminals of the transformer are configured to receive signals having a fundamental frequency of $f_0$, and wherein the resonant frequency of the harmonic trap is 3 $f_0$.

In an embodiment, the input terminals of the transformer are configured to receive a square wave with a fundamental frequency of $f_0$ from the digital Power Amplifier.

In an embodiment, the circuit further comprises a Voltage Controlled Oscillator, VCO, wherein the input terminals of the harmonic trap are connected to the input terminals of the transformer in a configuration such that the magnetic fields induced by the current of the harmonic trap suppresses the magnetic fields induced by the current of the transformer substantially at the VCO and substantially at or near the resonant frequency of the harmonic trap.

In an embodiment, the VCO is configured to have an oscillation frequency of 1.5 $f_0$.

In an embodiment, the circuit is an integrated circuit and wherein the coil of the harmonic trap is arranged to be integrated inside the coil of transformer on the layout of the integrated circuit.

In some embodiments, the transformer can be a Balun transformer.

In an embodiment, the circuit comprises a second harmonic trap, comprising input terminals coupled to the input terminals of the transformer and configured to suppress electrical signals at the input of the transformer at a second frequency.

In an embodiment, the input terminals of the second harmonic trap are coupled to the input terminals of the transformer in a configuration such that the harmonic trap and the transformer have opposing current polarity and a magnetic field induced by a current of the second harmonic trap suppresses a magnetic field induced by a current of the transformer in the far field substantially at the second frequency.

In an embodiment, the transformer comprises a DC feed, which is a short circuit to ground for AC signals.

In an embodiment, the harmonic trap comprises a common node which is a short circuit to ground for AC signals, and wherein the DC feed of the transformer is connected to the harmonic trap common ground.

In an embodiment, the circuit is an integrated circuit for a transceiver.

Another aspect of the disclosure provides for a circuit. The circuit can have a transformer. The transformer can have a first coil, a first pair of input terminals, and a first pair of output terminals. The transformer can produce a first current having a first direction through the first coil and a resulting in a first magnetic field. The circuit can also have a harmonic trap. The harmonic trap can have a second coil and a second pair of input terminals operably coupled to the first pair of input terminals. The harmonic trap can produce a second current through the second coil, the second current having a second direction opposite the first direction and resulting in a second magnetic field opposing the first magnetic field. The harmonic trap can also suppress electrical signals of at least one of the first input terminals and the first output terminals at a resonant frequency of the harmonic trap. The harmonic trap can also suppress the first magnetic field in a far field substantially at a resonant frequency of the harmonic trap.

Another aspect of the disclosure provides a method for suppressing magnetic fields in a circuit. The method can include producing, at a transformer, a first magnetic field, by applying a first current having a first direction through a first coil. The first coil can have a first pair of input terminals and a first pair of output terminals. The method can also include producing, at a harmonic trap, a second magnetic field opposing the first magnetic field, by applying a second current having a second direction through a second coil opposite the first direction. The harmonic trap can have a resonant frequency and a second pair of input terminals operably coupled to the first pair of input terminals. The method can also include suppressing electric signals of at least one of the first pair of input terminals and the first pair of output terminals. The method can also include suppressing the first magnetic field in a far field substantially at the resonant frequency of the harmonic trap.

Another aspect of the disclosure provides an apparatus for suppressing magnetic fields in a circuit. The apparatus can have means for producing a first magnetic field having a first pair of input terminals and a first pair of output terminals. The apparatus can also have means for producing a second magnetic field opposing the first magnetic field. The means for producing a second magnetic field can have a resonant frequency and a second pair of input terminals operably coupled to the first pair of input terminals. The apparatus can also have means for suppressing electric signals of at least one of the first pair of input terminals and the first pair of output terminals. The apparatus can also have means for suppressing the first magnetic field in a far field substantially at the resonant frequency of the means for producing a second magnetic field.

Another aspect of the disclosure provides an integrated circuit. The integrated circuit can have a primary winding having a first pair of input terminals to receive an input signal having a frequency f0. The first input signal can result in a first current having a first direction through the first winding to produce a first magnetic field. The integrated circuit can also have a secondary winding concentric with the first winding and operable to produce an output signal at a first pair of output terminals based on the first magnetic field. The integrated circuit can also have a harmonic winding having a second pair of input terminals electrically coupled to the first pair of input terminals. The second pair of windings can receive the input signal resulting in a second current having a second direction opposite the first direction through the harmonic winding to produce a second magnetic field opposing the first magnetic field. The harmonic winding can have a resonant frequency of three times f0. The first winding, the second winding, and the harmonic winding can be oriented or disposed coplanar to one another on the integrated circuit.

As will be apparent to one of ordinary skill, the disclosed features and descriptions of the embodiments that follow may be combined as appropriate, and may be combined with any of the aspects of the disclosure.

BRIEF DESCRIPTION OF DRAWINGS

Embodiments of this disclosure will be described, by way of example, with reference to the following drawings, in which.

Common reference numerals are used throughout the figures to indicate similar features.

DETAILED DESCRIPTION

Embodiments of the present disclosure are described below by way of example only. These examples represent the best ways of putting the disclosure into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
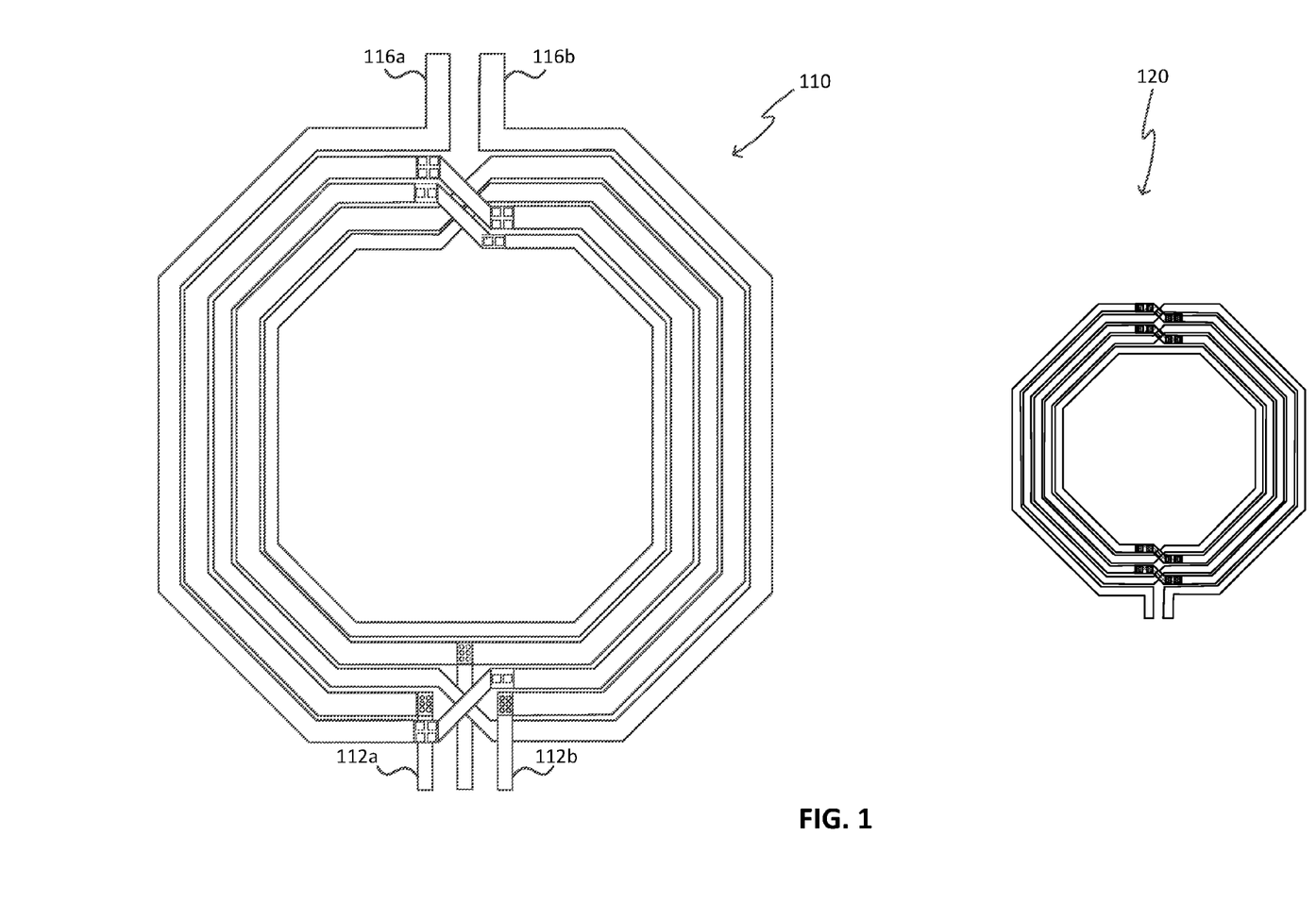
FIG. 1 is a schematic diagram illustrating a layout of coils in a transceiver integrated circuit.

FIG. 1 is a schematic diagram illustrating a layout of coils in a transceiver integrated circuit. The various coils shown in FIG. 1, and the various coils or windings as described herein can be metallized in an integrated circuit. In some embodiments, each of the coils can be coplanar. For example, each coil in the transceiver integrated circuit can be substantially flat or otherwise metallized on or etched into the integrated circuit.

The transceiver circuit comprises an impedance transformer 110 which is configured to transform an output impedance of a transmitter power amplifier (not shown in the Figures). The power amplifier may be a digital power amplifier and can be coupled to input terminals 112a, 112b. The impedance transformer 110 may be a Balun transformer. It may transform the output impedance of the power amplifier into 50 Ohm, which is the typical output impedance for an antenna. The impedance transformer 110 can have output terminals 116a, 116b

The transceiver circuit also comprises a Voltage Controller Oscillator (VCO) inductor comprising a VCO coil 120. The VCO coil 120 can be placed far from the transformer coil (e.g., the impedance transformer 110) to reduce the amount of magnetic and electric coupling between them. Other decoupling techniques include high resistivity substrate areas may be introduced underneath the coils as well as surrounding the coils by guard rings.

The digital power amplifier may produce output signals which have harmonic components. For example, the power amplifier may produce output signals in the form of a square wave, which consists of signals at a fundamental frequency ($f_0$) and signals at a plurality of harmonic frequencies (multiples of $f_0$). The harmonic content of the power amplifier signals may appear at the output of the Balun transformer 110 and hence at the antenna therefore failing certain regulatory specification regarding transmitting harmonic power outside the ISM band. The harmonic power at the Balun output can be filtered out using simple off-chip filters. However, the harmonic content may also cause drastic unwanted far field interference with other on-chip components, such as the VCO coil 120, and lead to unstable system turbulence.

To reduce the harmonic content in the impedance transformer 110, one or more harmonic traps may be coupled to the inputs of the impedance transformer 110 and configured to receive output signals from the digital power amplifier. Harmonic traps can be band-stop or band-pass filters for suppressing, canceling, or negating output signals of the power amplifier at one or more harmonic frequencies. A harmonic trap may be an L-C circuit forming a band-pass filter or a band-stop filter. Harmonic traps typically have a high voltage or current passive gain at resonance. They can reduce harmonic content at the source (power amplifier) which could lead to a cleaner output spectrum and a more efficient power amplifier. On the transceiver integrated circuit layout, harmonic trap(s) may be physically placed somewhere close to the Balun transformer near its input, at which the harmonics get suppressed. More harmonic suppression can be achieved by adding similar traps at the Balun output.

Figure 2:
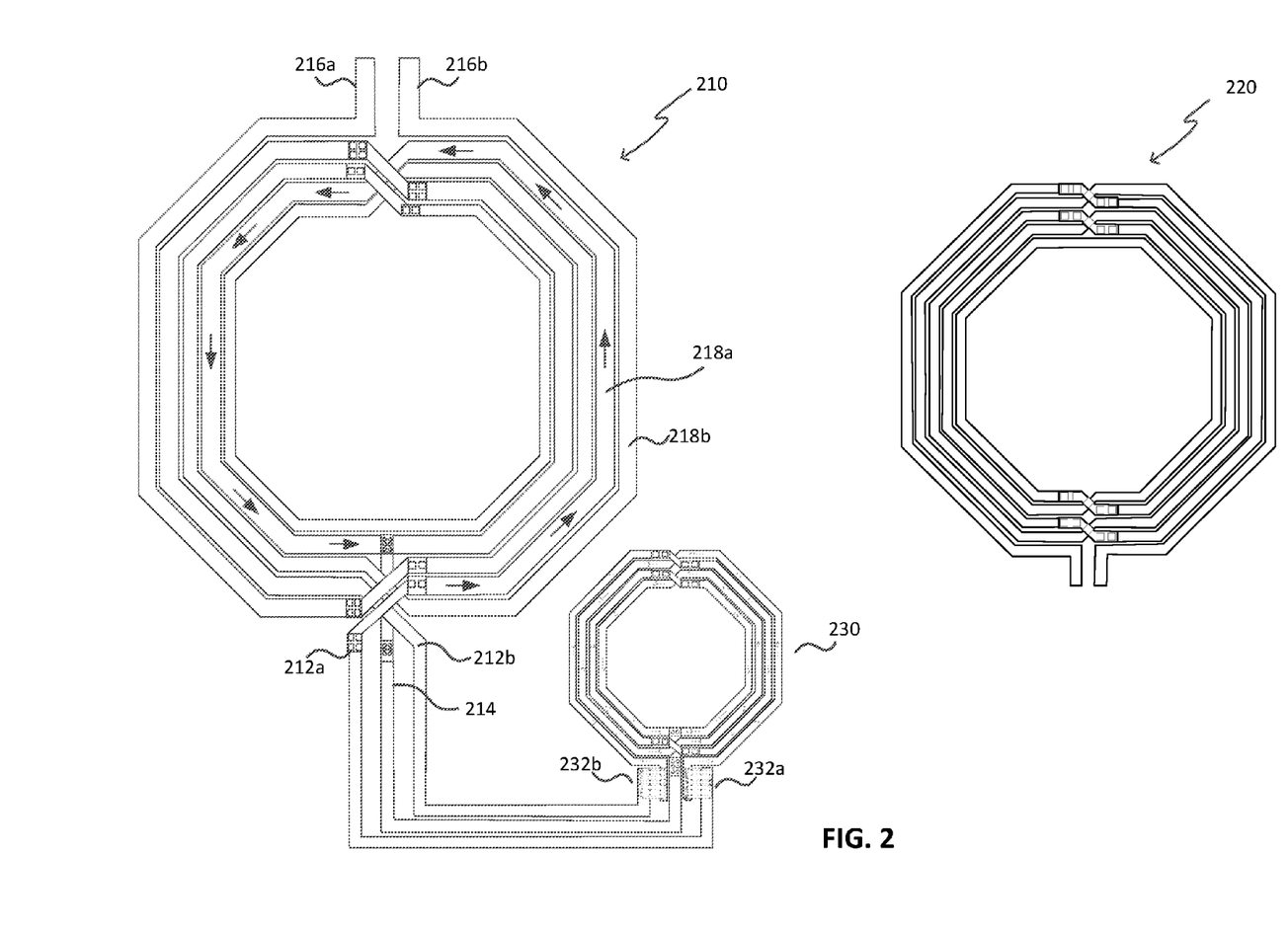
FIG. 2 is a schematic diagram illustrating a layout of coils in a transceiver integrated circuit comprising a harmonic trap.

FIG. 2 is a transceiver integrated circuit comprising a harmonic trap 230 configured to suppress the $3^{rd}$ harmonic component (at a frequency of $3 \times f_0$) of the power amplifier output.

The Balun transformer 210 and the VCO coil 220 can be similar to or the same as the Balun transformer 110 and the VCO coil 120 described above with reference to FIG. 1. The Balun transformer 210 comprises a primary winding 218a which receives signals from the power amplifier and a secondary winding 218b in which the currents are induced by the magnetic fields induced by changing currents in the primary winding 218a. Center tap (VDD) of the Balun transformer 210 may be coupled to the center point of the Harmonic Trap 230 at point 214, and may also be AC grounded at point 214 via a coupling capacitor (not shown in FIG. 2). This Harmonic Trap-Balun center tap connection is for balancing the currents in both coils to achieve maximal harmonic suppression. Alternatively, the coupling capacitor could be coupled between the Center tap (VDD) of the Balun transformer 210 and the center point of the Harmonic Trap 230.

As shown in FIG. 2, input terminals 232a and 232b of the $3 f_0$ harmonic trap 230 are electrically coupled to Balun input terminals 212a and 212b respectively. The $3 f_0$ harmonic trap 230 is configured to suppress the $3^{rd}$ harmonic component (at a frequency of $3 f_0$) of the Power amplifier at output terminals 216a, 216b of the Balun transformer 210.

However, according to Faraday's law of induction, both the Balun transformer 210 and the harmonic trap 230 also induce their respective magnetic fields while in operation. The magnetic fields induced by these coils may magnetically and/or electrically couple with other on chip components, such as the VCO, in the far field, leading to unwanted interference. Conventionally, the VCO coil 220 (e.g., an inductor) has to be separated as far as possible from transformer coil 210 and/or harmonic trap coil 230 to minimize the interference.

In one example, if the VCO coil 220 has an oscillation frequency of $1.5 f_0$, the strongest interference the Balun transformer 210 caused to the VCO coil 220 would be at a frequency of $3 f_0$, where the third harmonic component of the transformer output signal overlaps with the second harmonic component of the VCO coil 220. This interference could lead to VCO pulling (i.e. frequency variations in the oscillation frequency) and increased phase noise (degraded spectral purity). Therefore, in this example it would be beneficial to suppress the magnetic field at the frequency of $3 f_0$ induced by the Balun transformer 210 at the VCO coil 220.

In FIG. 2, the Balun transformer coil 210 and the harmonic trap coil 230 are configured to have the same input polarity, which means that the current flowing in the Balun 210 and the $3 f_0$ harmonic trap 230 are in phase while they are in operation (the white arrows and black arrows in FIG. 2 indicate differential current directions). As these currents are in phase, the magnetic fields induced by them in the far field may combine constructively at resonance and may cause severe magnetic coupling to adjacent coils such as the VCO coil 220. That is to say, the magnetic fields induced by the transformer 210 at the VCO coil 220 are strengthened by the magnetic fields induced by the harmonic trap 230 at the VCO coil 220 at the frequency of $3 f_0$.

The Balun transformer 210 and its associated harmonic trap 230 can be optimized to be small enough with respect to the operating frequency effective wavelength $\lambda$ (e.g. less than $\lambda/20$) and hence these passive on-chip components can be considered as a lumped element. Therefore the phase variation across these components becomes negligible, e.g. less than 0.1 degrees.

Figure 3:
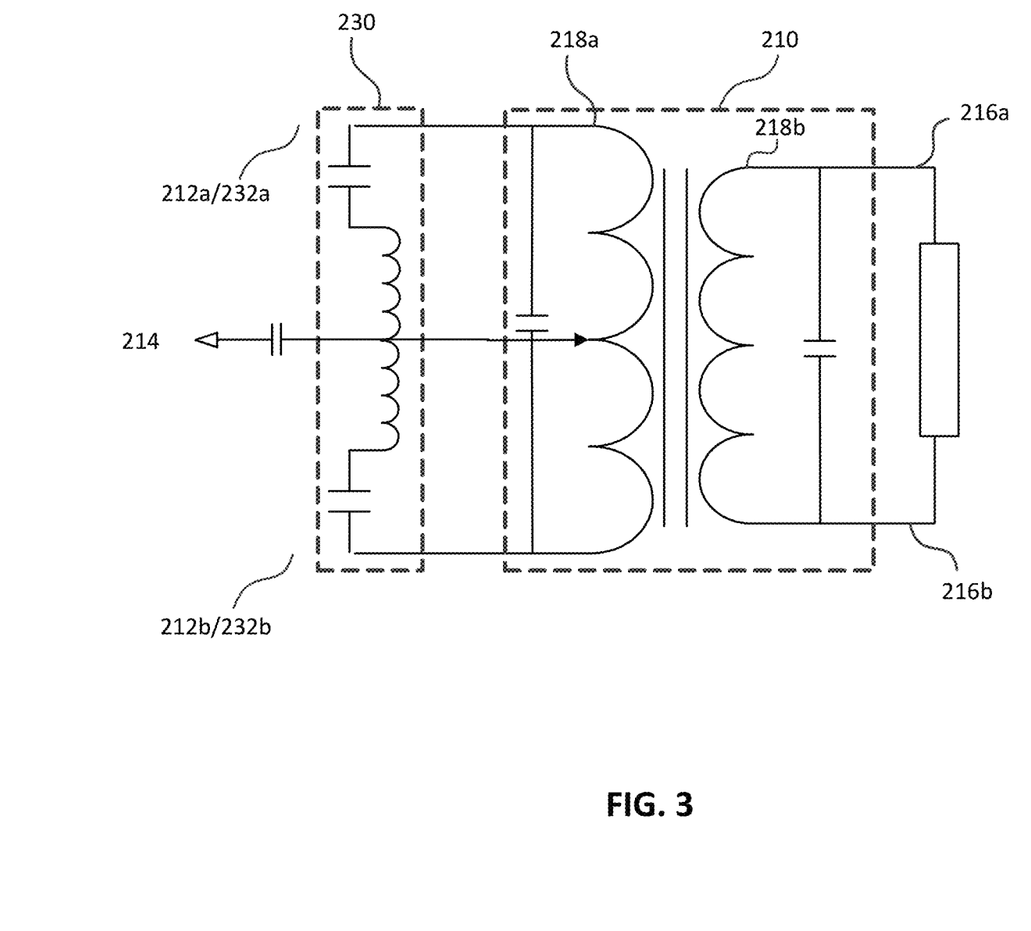
FIG. 3 is an equivalent circuit diagram of the transceiver integrated circuit of FIG. 2.

FIG. 3 is an equivalent circuit diagram of the transceiver integrated circuit of FIG. 2. FIG. 3 shows that the Balun transformer coil 210 and the harmonic trap coil 230 are arranged to have the same current polarity.

The harmonic trap 230 is represented by an L-C circuit. The harmonic trap 230 and the Transformer are connected to the Power Amplifier (not shown in the figures) in parallel at input terminals 212a/232a and 212b/232b. At resonant frequency ($3 f_0$) of the harmonic trap 230, the harmonic trap 230 has very low impedance, diverting currents away from the transformer coil 210 and reducing output voltage at output terminals 216a and 216b of the transformer at $3 f_0$. Therefore, the output signals of the transformer have been suppressed at $3 f_0$.

Figure 4:
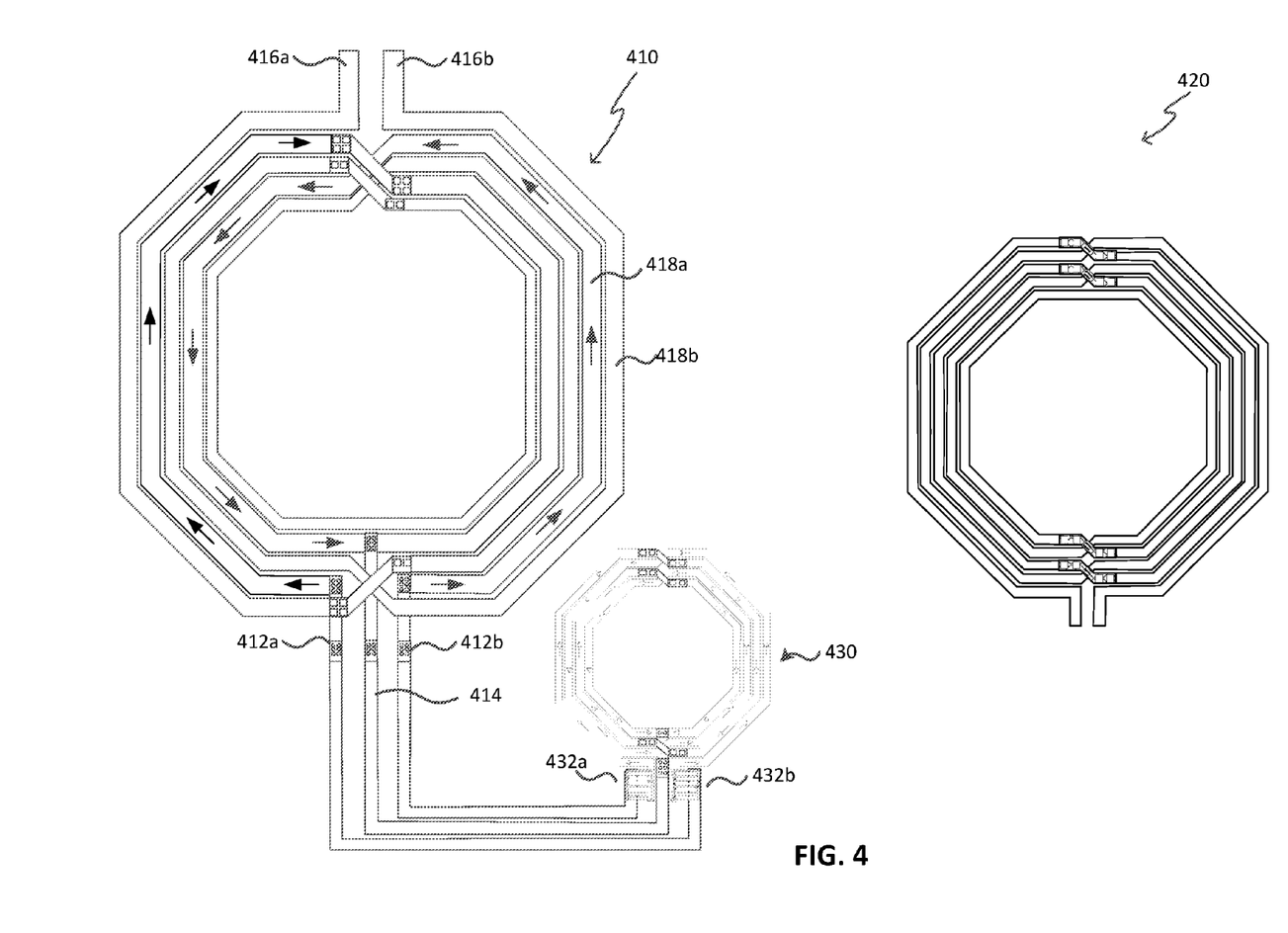
FIG. 4 is a schematic diagram illustrating a layout of coils in a transceiver integrated circuit according to a first embodiment of an improved circuit design.

FIG. 4 is a schematic diagram illustrating a layout of coils in a transceiver integrated circuit according to a first embodiment of an improved circuit design. Balun transformer 410 and VCO coil 420 are the same as the transformer 210 and the VCO coil 210 described above with reference to FIG. 2. Input terminals 412a, 412b, ground terminal 414, output terminals 416a, 416b, primary winding 418a and secondary winding 418b are the same as their counterpart Balun input terminals 212a, 212b, 216a, 216b, 218a and 218b as described above with reference to FIG. 2.

FIG. 4 shows that the current polarity of the $3 f_0$ coil of the harmonic trap 430 is reversed with respect to the current polarity of the Balun transformer 410. The 3 f0 harmonic trap 430 has input terminals 432a and 432b connected to the input terminals 412b and 412a of the Balun transformer 410 respectively. The white and black arrows in FIG. 4 represent different current directions. As indicated by these arrows, the currents flowing in the transformer coil and the harmonic trap coil are in opposing directions (i.e. the current indicated by the white arrows in the Balun transformer 410 is in a clockwise direction and the white arrows in the harmonic trap 430 is in a counter-clockwise direction). As noted above, in some embodiments, the primary winding 418a, the secondary winding 418b, and the coil(s) of the harmonic trap 430 can be substantially coplanar. Thus each winding or coil can have a substantially flat profile within an integrated circuit.

According to the Faraday's law of induction, the coils (e.g., the Balun transformer 410 and the harmonic trap 430) induce magnetic fields substantially in opposing directions. Therefore, reversing the current polarity of the harmonic trap 430 with respect to that of the Balun transformer 410 causes the magnetic field induced by the harmonic trap 430 at the VCO coil 420 to be in a substantially opposite direction to the magnetic field induced by the Balun transformer 410 at the VCO coil.

The magnetic fields induced by these coils in the far field combine destructively at resonance and cause reduced magnetic coupling in the far field with adjacent coils such as the VCO 420 in FIG. 4. In other words, the magnetic fields induced by the Balun transformer 410 in the far field, e.g. at the VCO coil 420, are suppressed by the magnetic fields induced by the harmonic trap 430 at the VCO coil 420, in particular at the frequency of 3 $f_0$, the resonant frequency of the harmonic trap. This leads to a far field magnetic cancellation at 3 $f_0$ resonance, reducing VCO pulling and phase noise. In order to achieve maximum cancellation at the frequency where the cancellation is desired, the current in the Balun Transformer and the current in the harmonic trap can be substantially the same in magnitude and opposite in phase. As the magnetic coupling/interference between the transceiver coils (e.g., the Balun transformer 410 and the harmonic trap 430) and the VCO coil 420 is reduced, they can be placed closer to each other compared to their distances in the layouts of FIG. 1 and FIG. 2. This helps make efficient use of silicon area of the transceiver integrated circuit and reduce costs.

Figure 5:
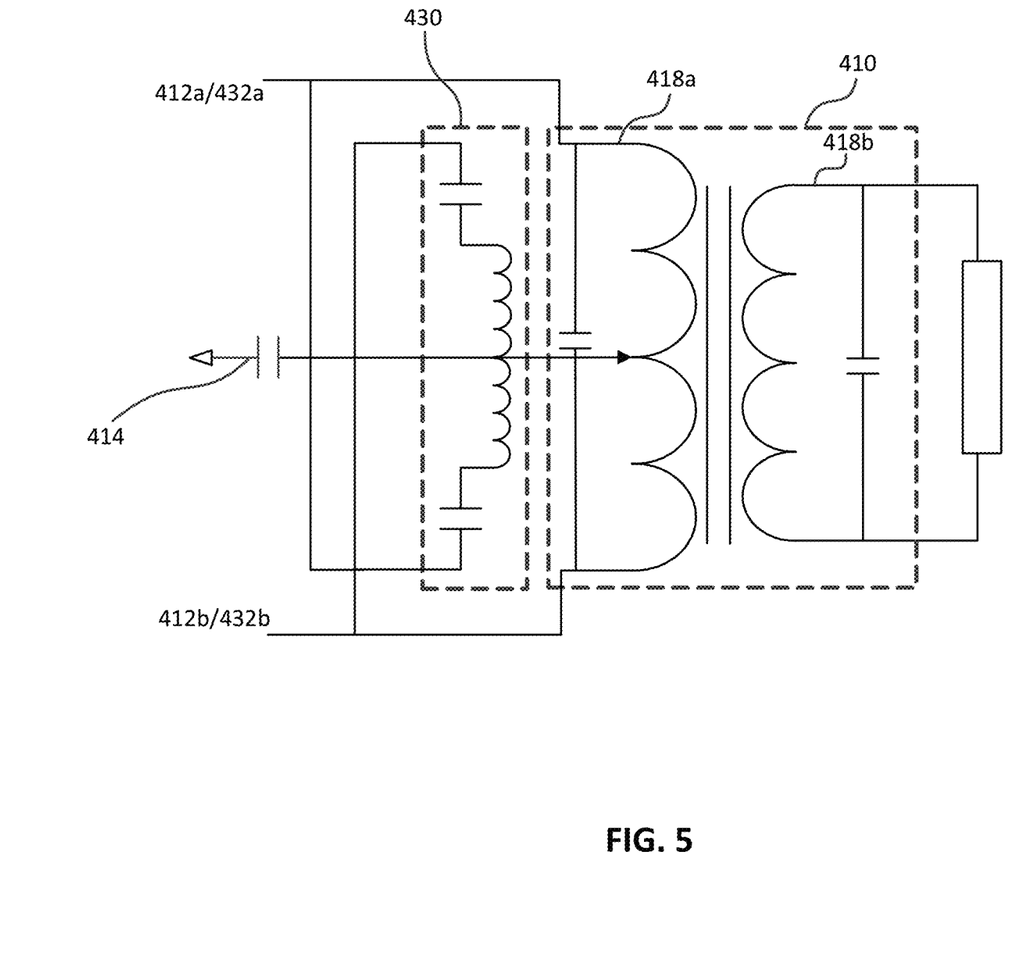
FIG. 5 is an equivalent circuit diagram of the transceiver integrated circuit of FIG. 4 according to the first embodiment of an improved circuit design.

FIG. 5 is an equivalent circuit diagram of the transceiver integrated circuit layout of FIG. 4. FIG. 5 shows that the current polarity of the harmonic trap 430 is flipped horizontally by 180° with respect to that of the primary winding 418a of the Balun transformer 410 compared to the circuit of FIG. 3, causing the current in the transformer primary winding and that in the harmonic trap flowing in opposing polarities/directions.

The terminal 414 is provided with a DC feed which is short circuit to ground for AC signals. The harmonic trap 430 may comprise a common node which is also a short circuit to ground for AC signals. The DC feed of the transformer may be connected to the harmonic trap common ground. This connection acts to align balanced currents flowing in the Balun transformer and the harmonic trap.

Figure 6:
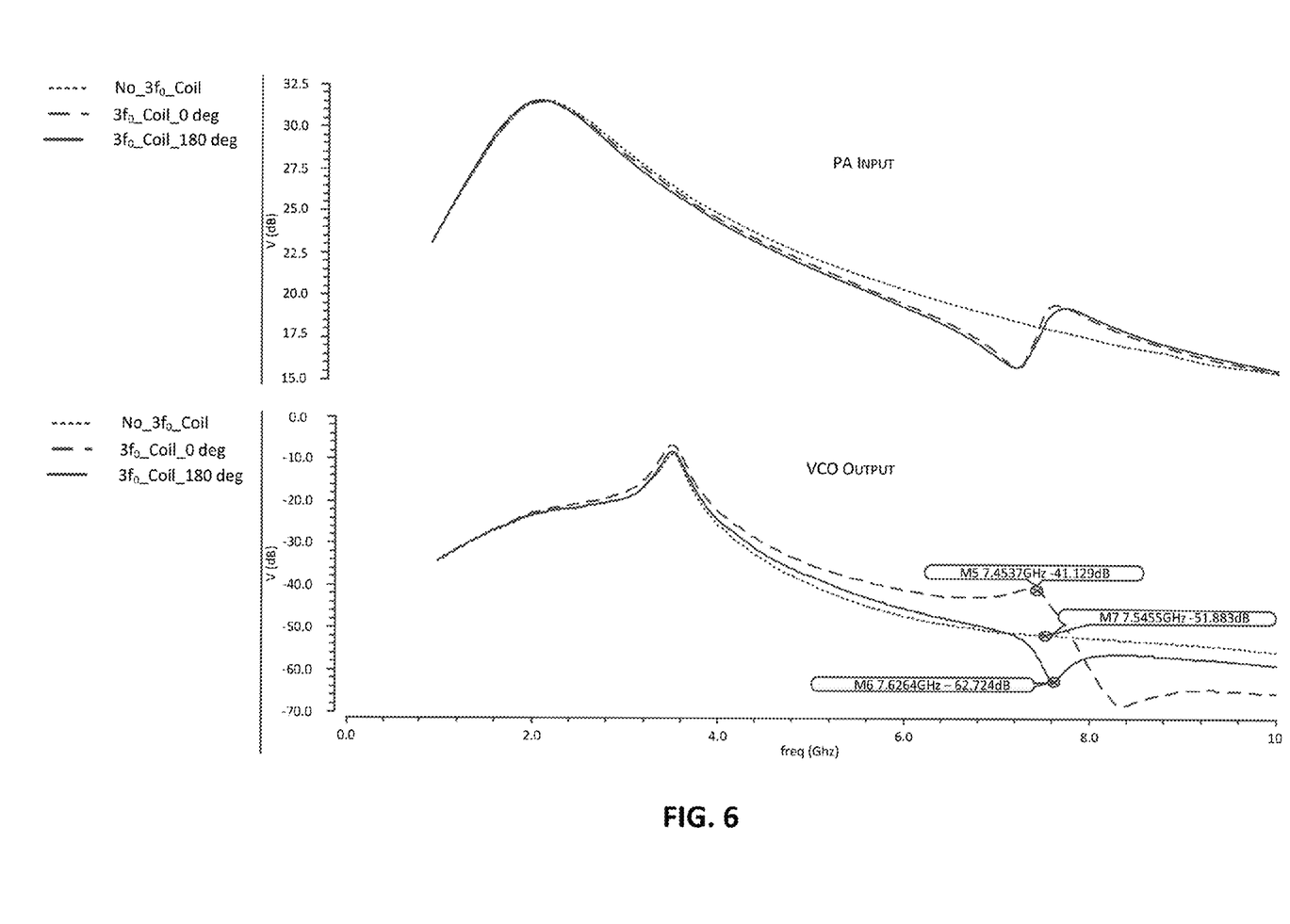
FIG. 6 is a plot diagram of frequency responses of a power amplifier output and a VCO output in various circuit configurations, including the circuit configuration according to the first embodiment of an improved circuit design.

FIG. 6 is a plot diagram of frequency responses of a power amplifier output (or Balun input) and a VCO output in various circuit configurations, including the circuit configurations of FIG. 1, FIG. 2, and FIG. 4. An alternating current, AC, stimulus is applied at the Balun input (representing the Power Amplifier) while observing the coupling to the VCO inductor. The horizontal axis of FIG. 6 represents the frequencies at which the power amplifier output and VCO output are measured. The upper half of FIG. 6 shows the voltage synthesized on the input of the Balun transformer (power amplifier output), and the lower half of FIG. 6 shows the voltage synthesized at the VCO coil output due to magnetic coupling.

The dotted lines show the case where no harmonic trap is included in the circuit (the case of FIG. 1). The dashed lines show the case where the 3 $f_0$ harmonic trap is included in the circuit and the current in the $3^{rd}$ harmonic trap is in-phase with the Balun current (the case of FIG. 2 and FIG. 3). The solid lines show the case where the 3 $f_0$ harmonic trap is included and its current is arranged to be out of phase with or have a reversed polarity with the Balun current (the case of FIG. 4 and FIG. 5).

The upper half of FIG. 6 shows that the power amplifier has a fundamental frequency $f_0$ of around 2.5 GHz. The lower half of FIG. 6 shows that a destructive far field effect (or far field cancellation) at the VCO is obtained at around 3 $f_0$ when the Balun (as indicated by the notch in the solid curve) and 3 $f_0$ harmonic trap coils are arranged to have the current directivities/polarities opposing each other.

Figure 7:
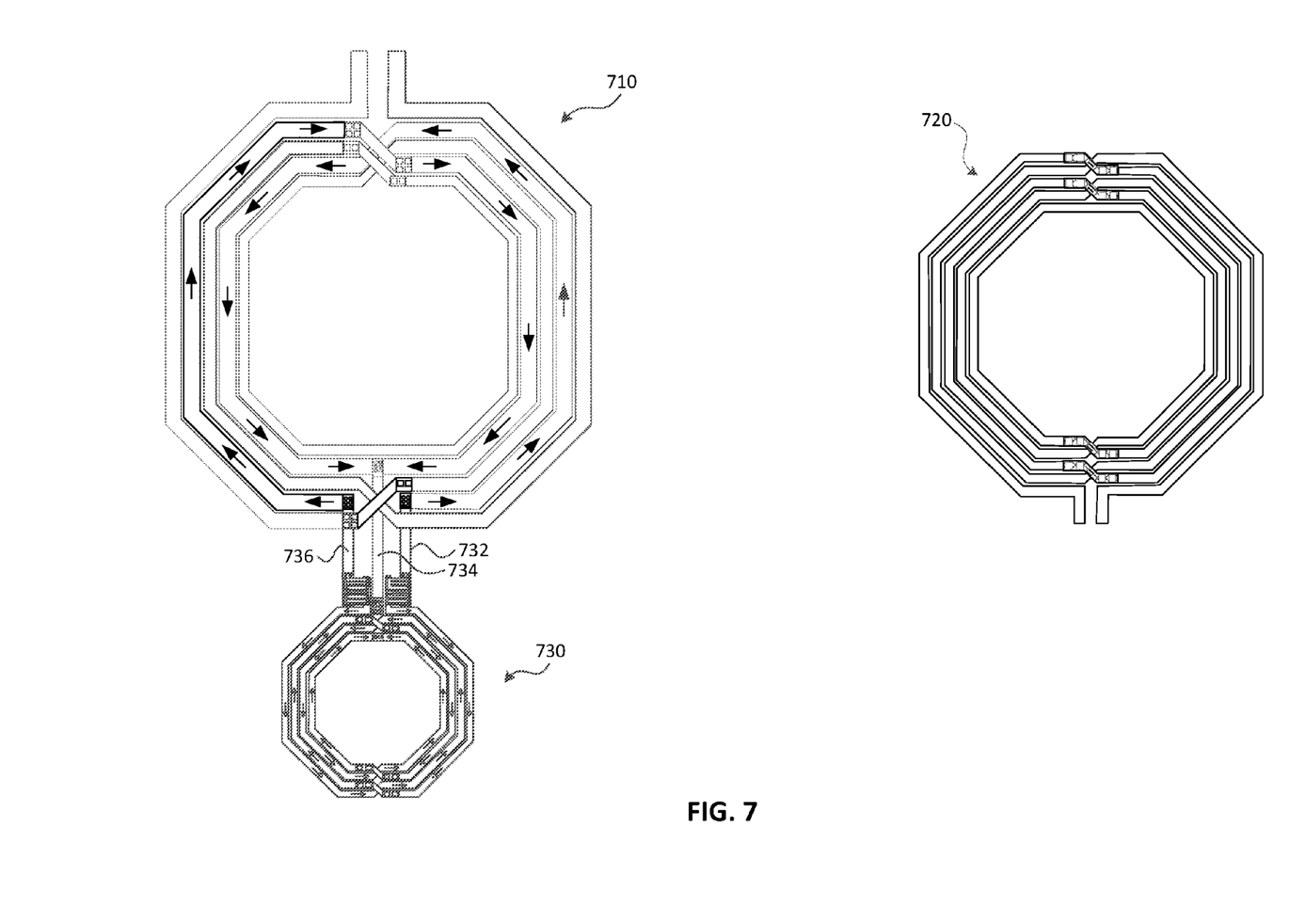
FIG. 7 is a schematic diagram illustrating a layout of coils in a transceiver integrated circuit according to a second embodiment of an improved circuit design.

FIG. 7 is a schematic diagram illustrating a layout of coils in a transceiver integrated circuit according to another embodiment of an improved circuit design. In an embodiment, the coil of the transformer 710 can be connected to the coil of the harmonic trap 730 by tracks 732, 734, 736. The transformer 710 and the harmonic trap 730 can be aligned such that the tracks 732, 734, 736 connecting them are straight. In some embodiments, the tracks 732, 736 can correspond to the input terminals 212a, 212b (FIG. 2) for example, while the track 734 can correspond to the point 714 (e.g., a ground point). This straight orientation of the coils 710, 720 reduces the total amount of silicon area occupied by the coils 710, 720 and the tracks 732, 734, 736 connecting them on the integrated circuit. The layout of FIG. 7 can provide a similar far field suppression/cancellation effect for the reasons explained with reference to FIG. 4 and FIG. 5.

Figure 8:
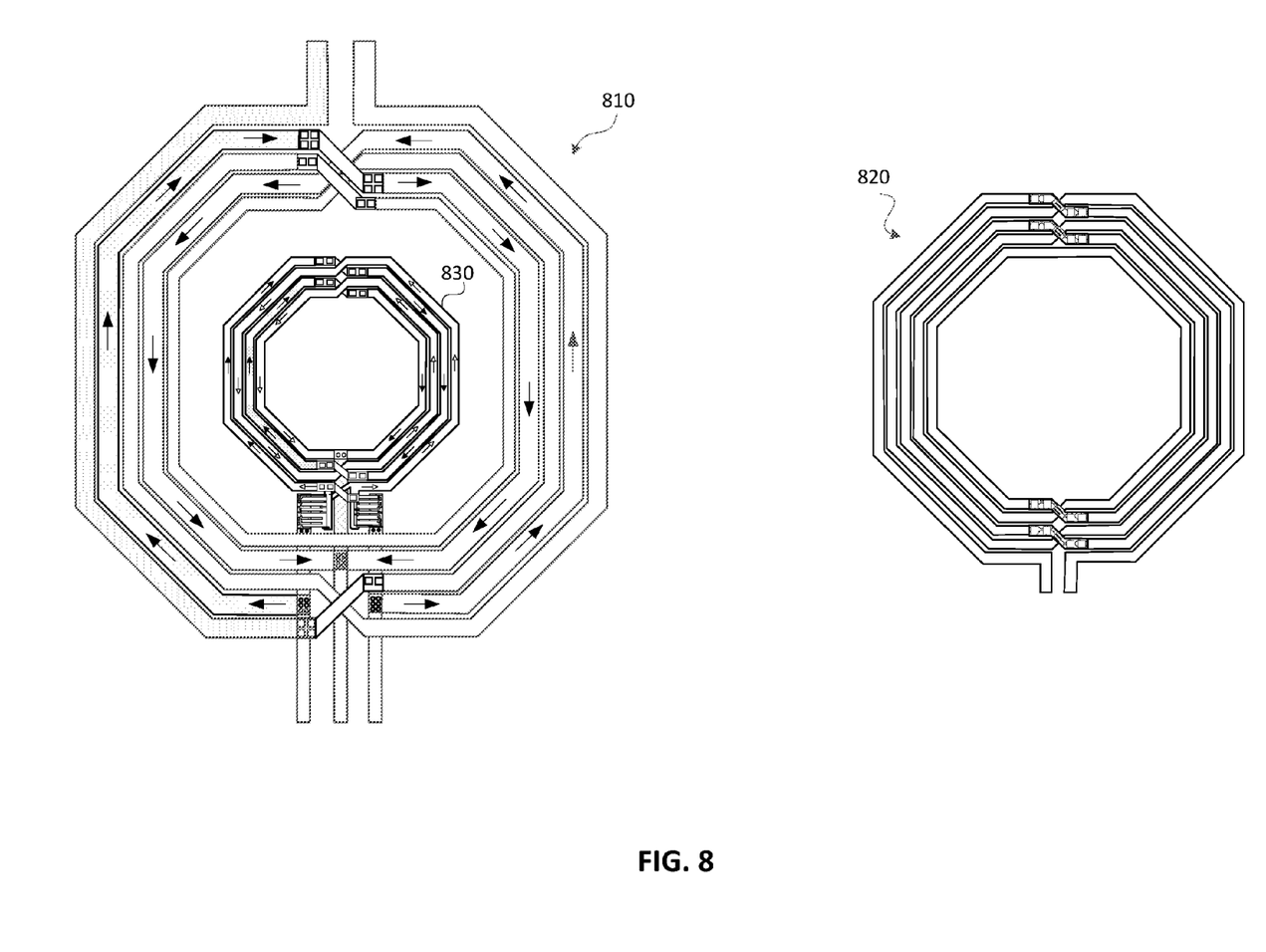
FIG. 8 is a schematic diagram illustrating a layout of coils in a transceiver integrated circuit according to a third embodiment of an improved circuit design.

FIG. 8 is a schematic diagram illustrating a layout of coils in a transceiver integrated circuit system according to a third embodiment of an improved circuit design. In this embodiment, the harmonic trap 830 is integrated inside the Balun transformer 810, which helps saving Silicon area. The layouts in FIG. 8 can provide a similar far field suppression/cancellation effect for the reasons explained with reference to FIG. 4 and FIG. 5. This configuration can give, to a very large extent, a uniform far field cancellation or negation due to the symmetrical displacement between the Balun and 3 $f_0$ harmonic trap coil.

Compared with the circuits shown in FIG. 1 and FIG. 2, in which the VCO needs to be separated far from the Balun transformer to reduce magnetic coupling, the embodiments shown in FIG. 4, FIG. 7, and FIG. 8 can reduce the distance between the VCO and the Balun transformer without introducing excessive magnetic coupling. In one example, the separation between the VCO and the Balun transformer is 400 µm for the configuration of FIG. 1, and the separation between the VCO and the Balun transformer can be reduced to 250 µm for the configuration of FIG. 8.

Figure 9:
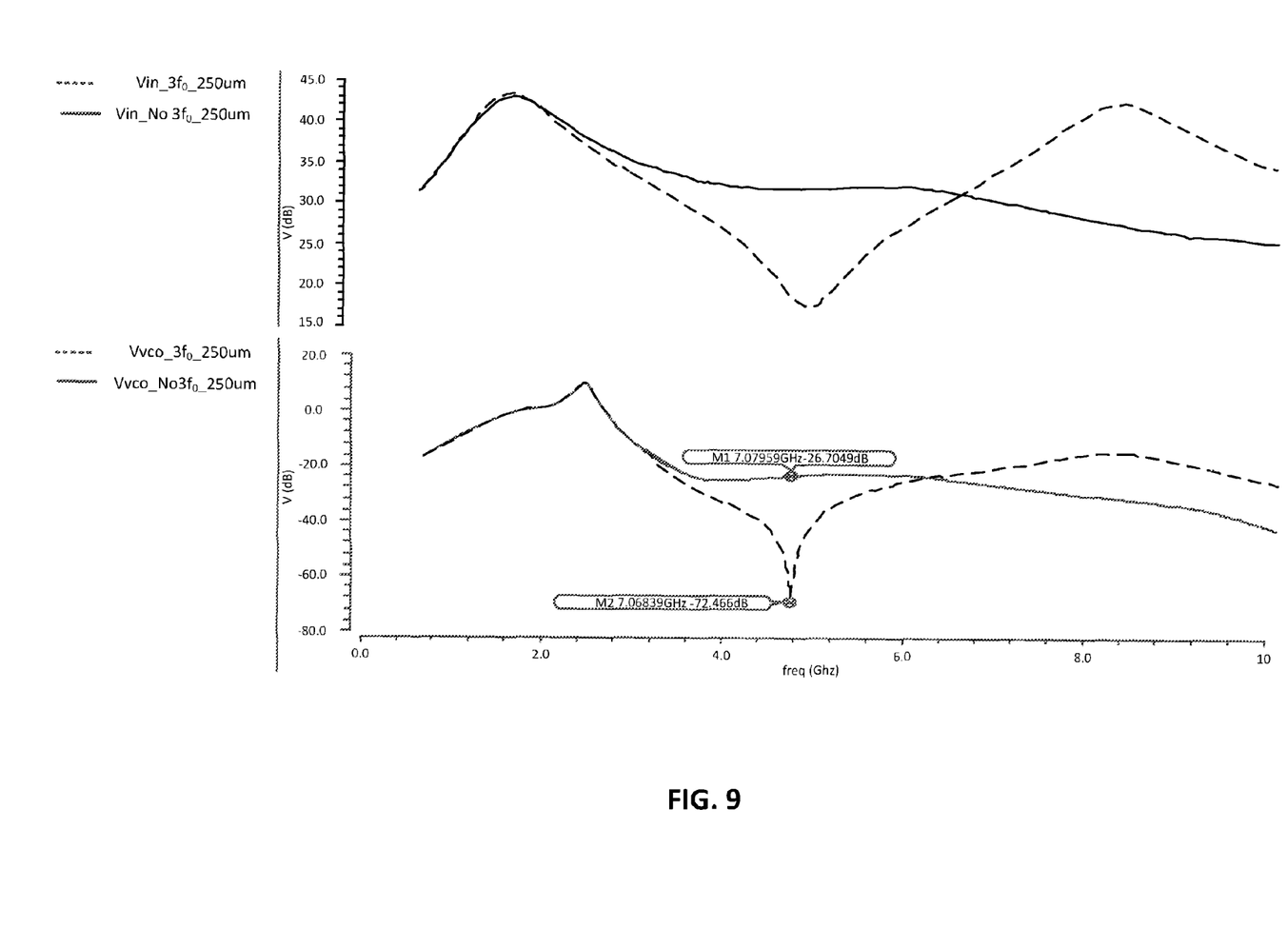
FIG. 9 is a plot diagram of frequency responses of a power amplifier output and a VCO output in various circuit configurations, including the circuit configuration according to the third embodiment of an improved circuit design.

FIG. 9 is a plot diagram of frequency responses of a power amplifier output and a VCO output in various circuit configurations, including the circuit configurations of FIG. 1 and FIG. 8.

The horizontal axis represents the frequency of the input signal. The upper half of FIG. 9 shows the voltage at the input of the Balun transformer (power amplifier output), and the lower half of the FIG. 9 indicates the effect of magnetic coupling at the VCO.

The solid lines show the case where no harmonic trap is included near the Balun (the case of FIG. 1) and the dashed lines show the case where the 3 $f_0$ harmonic trap is integrated inside the Balun transformer and its current is out of phase (have a reversed polarity with) the current of the Balun transformer (the case of FIG. 8). The dashed line shows a very strong 3rd harmonic far field cancellation at the VCO.

It will be appreciated that although the embodiments described above refer to a harmonic trap for suppressing the $3^{rd}$ harmonic frequency component, the harmonic trap may be configured to suppress any other harmonic frequency component of the digital Power Amplifier. The skilled person would understand how to adjust the resonant frequency of the harmonic trap, e.g. by changing the size of the inductor or capacitor of the trap and/or changing the Q factor of the trap and/or adjust the current of the harmonic trap to change the frequency at which far field cancellation occurs.

It will be appreciated that although the embodiments described herein may show only a single harmonic trap, the inputs of the impedance transformer 110 may be coupled to a plurality of harmonic traps (e.g., the harmonic trap 430, 730, 830). The plurality of harmonic traps can be configured to suppress the same or different harmonic frequency components of the digital Power Amplifier. It will be also appreciated that although in the embodiments described, the harmonic traps are electrically coupled to the inputs of the impedance transformer 110, the harmonic traps may also are be electrically coupled to the outputs of the impedance transformer 110 in other embodiments.

It will be appreciated that although in the embodiments described, the VCO has an oscillation frequency of 1.5 $f_0$ (1.5 times of the fundamental frequency of the digital power amplifier output signals), it may have a different oscillation frequency. It will be appreciated that in the embodiments described, although the harmonic traps are designed to suppress the third harmonic frequency component (e.g., 3 $f_0$) of the digital Power Amplifier, it may be designed to suppress any other harmonic frequency component of the digital Power Amplifier. In some examples, any integer harmonic of an input signal from the digital Power Amplifier can be used.

Any range or device parameter given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

It will be understood that the above descriptions of various embodiment are given by way of example and not by limitation. Accordingly, various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this disclosure.

What is claimed is:

1. A circuit, comprising:
   a transformer, having a first coil, a first pair of input terminals, and a first pair of output terminals, the transformer operable to produce a first current having a first direction through the first coil resulting in a first magnetic field; and
   a harmonic trap, having a second coil and a second pair of input terminals operably coupled to the first pair of input terminals, the harmonic trap being configured to produce a second current through the second coil, the second current having a second direction opposite the first direction and resulting in a second magnetic field opposing the first magnetic field, the harmonic trap further configured to
   suppress electrical signals of at least one of the first input terminals and the first output terminals at a resonant frequency of the harmonic trap, and
   suppress the first magnetic field in a far field substantially at a resonant frequency of the harmonic trap.

2. The circuit of claim 1, wherein the first pair of input terminals of the transformer are configured to receive a signal from a digital Power Amplifier.

3. The circuit of claim 2, wherein the first pair of input terminals of the transformer are configured to receive the signal having a fundamental frequency ($f_0$), wherein the resonant frequency of the harmonic trap is three times $f_0$.

4. The circuit of claim 2, wherein the first pair of input terminals of the transformer are configured to receive a square wave with a fundamental frequency of $f_0$ from the digital Power Amplifier.

5. The circuit of claim 2, further comprising a Voltage Controlled Oscillator (VCO) magnetically coupled to the transformer, wherein the second pair of input terminals of the harmonic trap are connected to the first pair of input terminals of the transformer in a configuration such that the second magnetic field induced by the second current of the harmonic trap suppresses the first magnetic field induced by the first current of the transformer substantially at an oscillation frequency of the VCO and substantially at the resonant frequency of the harmonic trap.

6. The circuit of claim 5, wherein the oscillation frequency of the VCO is 1.5 times a fundamental frequency ($f_0$) of the signal received at the first pair of input terminals.

7. The circuit of claim 1, wherein the circuit is an integrated circuit and wherein the second coil of the harmonic trap is arranged to be integrated inside the first coil of the transformer on a layout of the integrated circuit.

8. The circuit of claim 1, wherein the transformer is a Balun transformer.

9. The circuit of claim 1, comprising a second harmonic trap, comprising a third pair of input terminals coupled to the first pair of input terminals of the transformer and configured to suppress electrical signals at the first pair of input terminals at a second frequency,
   wherein the third pair of input terminals of the second harmonic trap are coupled to the first pair of input terminals of the transformer in a configuration such that the second harmonic trap and the transformer have opposing current polarity and a third magnetic field induced by a current of the second harmonic trap suppresses the first magnetic field in the far field substantially at the second frequency.

10. The circuit of claim 1, wherein the transformer comprises a DC feed, which is a short circuit to ground for AC signals.

11. The circuit of claim 10, wherein the harmonic trap comprises a common node which is a short circuit to ground for AC signals, and wherein the DC feed of the transformer is connected to common ground of the harmonic trap.

12. The circuit of claim 1, wherein the circuit is an integrated circuit for a transceiver.

13. A method for suppressing magnetic fields in a circuit comprising:
    producing, at a transformer, a first magnetic field, by applying a first current having a first direction through a first coil, the first coil having a first pair of input terminals and a first pair of output terminals;

producing, at a harmonic trap, a second magnetic field opposing the first magnetic field, by applying a second current having a second direction through a second coil opposite the first direction, the harmonic trap having a resonant frequency and a second pair of input terminals operably coupled to the first pair of input terminals;

suppressing electric signals of at least one of the first pair of input terminals and the first pair of output terminals; and suppressing the first magnetic field in a far field substantially at the resonant frequency of the harmonic trap.

14. The method of claim 13 further comprising receiving a signal from a digital Power Amplifier at the first pair of input terminals.

15. The method of claim 14 further comprising receiving the signal at the first pair of input terminals having a fundamental frequency of $f_0$,
wherein the resonant frequency of the harmonic trap is three times $f_0$.

16. The method of claim 14 further comprising receiving a square wave with a fundamental frequency of $f_0$ from the digital Power Amplifier.

17. The method of claim 14 wherein a Voltage Controlled Oscillator (VCO) is magnetically coupled to the first coil,
wherein the second magnetic field suppresses the first magnetic field substantially at an oscillation frequency of the VCO and substantially at the resonant frequency of the harmonic trap.

18. The method of claim 17 wherein the oscillation frequency of the VCO is 1.5 times $f_0$.

19. The method of claim 13 wherein the circuit is an integrated circuit and wherein the second coil is arranged to be integrated inside the first coil on the layout of the integrated circuit.

20. The method of claim 13, wherein the transformer is a Balun transformer.

21. An apparatus for suppressing magnetic fields in a circuit comprising:
means for producing a first magnetic field having a first pair of input terminals and a first pair of output terminals;
means for producing a second magnetic field opposing the first magnetic field, the means for producing a second magnetic field having a resonant frequency and a second pair of input terminals operably coupled to the first pair of input terminals;
means for suppressing electric signals of at least one of the first pair of input terminals and the first pair of output terminals; and
means for suppressing the first magnetic field in a far field substantially at the resonant frequency of the means for producing a second magnetic field.

22. The apparatus of claim 21 further comprising means for receiving a signal from a digital Power Amplifier at the first pair of input terminals.

23. The apparatus of claim 22, wherein the means for receiving receives the signal having a fundamental frequency ($f_0$), and wherein the resonant frequency of the means for producing a second magnetic field is three times $f_0$.

24. The apparatus of claim 22 further comprising means for receiving a square wave with a fundamental frequency of $f_0$ from the digital Power Amplifier.

25. The apparatus of claim 22 wherein a means for oscillating is magnetically coupled to the means producing a first magnetic field, wherein the second magnetic field suppresses the first magnetic field substantially at an oscillation frequency of the means for oscillating and substantially at the resonant frequency of the means for producing a second magnetic field.

26. The apparatus of claim 25 wherein an oscillation frequency of the means for oscillating is 1.5 times a fundamental frequency ($f_0$) of the signal received by the means for receiving.

27. The apparatus of claim 21 wherein the circuit is an integrated circuit and wherein the means for producing a second magnetic field is arranged to be integrated inside the means for producing a first magnetic field on a layout of the integrated circuit.

28. The apparatus of claim 21, wherein the means for producing a first magnetic field is a Balun transformer and wherein the means for producing a second magnetic field is a harmonic trap.

29. An integrated circuit, comprising:
a primary winding having a first pair of input terminals and operable to receive an input signal having a frequency $f_0$, the first input signal resulting in a first current having a first direction through the first winding to produce a first magnetic field;
a secondary winding concentric with the first winding and operable to produce an output signal at a first pair of output terminals based on the first magnetic field;
a harmonic winding having a second pair of input terminals electrically coupled to the first pair of input terminals and operable to receive the input signal resulting in a second current having a second direction opposite the first direction through the harmonic winding to produce a second magnetic field opposing the first magnetic field.

30. The integrated circuit of claim 29,
wherein the harmonic winding has a resonant frequency of three times $f_0$,
wherein the second winding is concentric with the first winding, and
wherein the first winding, the second winding, and the harmonic winding are disposed coplanar to one another on the integrated circuit.

* * * * *